United States Patent
Fernihough et al.

(10) Patent No.: US 6,311,760 B1
(45) Date of Patent: Nov. 6, 2001

(54) METHOD AND APPARATUS FOR CASTING DIRECTIONALLY SOLIDIFIED ARTICLE

(75) Inventors: John Fernihough, Baden; Maxim Konter, Klingnau, both of (CH)

(73) Assignee: Asea Brown Boveri AG, Baden (CH)

( * ) Notice: Subject to any disclaimer, the term of this patent is extended or adjusted under 35 U.S.C. 154(b) by 0 days.

(21) Appl. No.: 09/373,719

(22) Filed: Aug. 13, 1999

(51) Int. Cl.[7] .................................................. B22D 27/04
(52) U.S. Cl. ................................... 164/122.1; 164/122.2; 164/338.1; 164/348
(58) Field of Search ............................. 164/122.1, 122.2, 164/338.1, 348

(56) References Cited

U.S. PATENT DOCUMENTS

| | | | |
|---|---|---|---|
| 1,793,672 | 2/1931 | Bridgman | 117/83 |
| 3,620,686 | * 11/1971 | Pfann | 164/122.1 |
| 3,635,279 | * 1/1972 | Matsunaga et al. | 164/128 |
| 3,690,367 | * 9/1972 | Daniels | 164/348 |
| 3,763,926 | 10/1973 | Tschinkel et al. | 164/338.1 |
| 3,847,203 | * 11/1974 | Northwood | 164/122.1 |
| 4,108,236 | 8/1978 | Salkeld | 164/122.1 |
| 4,175,609 | * 11/1979 | El Gammal et al. | 164/122.2 |
| 4,573,516 | * 3/1986 | Quested et al. | 164/122.1 |
| 4,862,947 | 9/1989 | Horton et al. | 164/122.2 |
| 5,398,745 | 3/1995 | Cook | 164/122.1 |
| 5,921,310 | * 7/1999 | Kats et al. | 164/122.1 |
| 5,988,257 | * 11/1999 | Hugo | 164/122.1 |
| 6,085,827 | * 7/2000 | Hugo | 164/348 |

FOREIGN PATENT DOCUMENTS

| | | |
|---|---|---|
| 0 749 790 A1 | 12/1996 | (EP) . |
| 0 891 828 A1 | 1/1999 | (EP) . |
| 2 152 649 | 4/1973 | (FR) . |
| 863171 | * 9/1981 | (RU) ................................ 164/122.2 |
| 96/05006 | 2/1996 | (WO) . |

OTHER PUBLICATIONS

E. Fras et al.: "Processing and Microstructure of Investment Casting Turbine Blade Nitac In–Situ Composites" Journal of Materials Engineering and Performance, US, ASM International, Materials Park, vol. 5, No. 1, Feb. 1, 1996, pp. 103–110.

Dexin MA et al.: "Einkristallerstrraung Der Ni–Basis–Superlegierung SRR 99" Zietschrift Fur Metallkunde, Stuttgart, Germany, vol. 82, No. 11, Nov. 1, 1991, pp. 869–873.

Giamei and Tschinkel, Metallurgical Transactions A, vol. 7A (Sep. 1976), pp. 1427–1434.

ASM International, "Directionally Solidified and Single Crystal Superalloys", The Metals Handbook, Tenth Edition, vol. 1 (1990), p. 1005.

* cited by examiner

*Primary Examiner*—Robert Davis
(74) *Attorney, Agent, or Firm*—Burns, Doane, Swecker & Mathis, L.L.P.

(57) ABSTRACT

A method of casting a directionally solidified article such as a component of a gas or steam turbine. The casting is performed in a casting furnace comprising a heating chamber, a liquid cooling bath as a cooling chamber and a shell mold. During casting, shell mold is fed with liquid metal and withdrawn from the heating chamber to the cooling chamber while the interior of the casting furnace is supplied with an inert atmosphere of Ar and/or He in the pressure range of 0.01 to 1 atmosphere, with a preferred range of 0.05 to 0.25 atmosphere. The method can provide improved heat transfer across the shell mold allowing a higher withdrawal rate, reduction in defects and/or improvement in properties of the cast articles.

20 Claims, 2 Drawing Sheets

METHOD AND APPARATUS FOR CASTING DIRECTIONALLY SOLIDIFIED ARTICLE

FIELD OF THE INVENTION

The invention relates to a method and an apparatus for casting a directionally solidified article.

BACKGROUND OF THE INVENTION

The Liquid Metal Cooling Process (LMC) is a well known variation of the investment casting directional solidification process in which a shell mold which forms a cavity resembling the final part to be manufactured is filled with a liquid alloy, and lowered from a hot zone into a cold zone. The hot zone is usually maintained at above the temperature of solidification of the alloy being used and the cold zone is well below this temperature. As the mold is drawn at a controlled rate into the cold zone, solidification occurs directionally beginning with the first portion of the mold to enter the cold zone. The mold may be supported on a chill plate used for a structural base and also to rapidly remove heat from the bottom-most portions of the casting. The typical Bridgman process (see, for example, U.S. Pat. No. 1,793,672) uses a water-cooled copper or steel lined vacuum chamber as a means of cooling the shell mold by radiation. There is a baffle made of an insulating material between the cold zone and hot zone which prevents excessive heat flow therebetween. The baffle is shaped so as to let the shell mold pass through it with only a minimum amount of clearance space between the mold and the baffle. This further minimizes heat flow from the hot zone to the cold zone, maintains the solidification front of the material in the shell mold at a level close to that of the baffle, which is desirable, and maximizes the thermal gradient across the solidification front.

The LMC process (see, for example, U.S. Pat. No. 3,763,926) uses a liquid medium (usually aluminum or tin) kept at a controlled temperature as the cold zone. While U.S. Pat. No. 3,763,926 discloses a stationary baffle similar to that used in the Bridgman process, a variation of this, using a baffle which floats on the surface of the liquid coolant, is disclosed in U.S. Pat. No. 4,108,236. Those familiar with the art of directional solidification understand that the rate of heat transfer achievable at the surface of the shell mold is much greater when using liquid metal as a coolant than simply relying on radiation cooling in vacuum. It can be shown by calculations that the effect of LMC is 70 to 100% greater heat transfer away from the shell mold surface compared to pure radiation heat transfer.

The Bridgman and LMC directional solidification processes have been used for the industrial production of columnar grained and single crystal articles destined for high temperature service and composed of Ni-based superalloys. Those familiar with the solidification of Ni-based superalloys understand the great advantages of the higher gradients across the solidification front achieved during the LMC process; as outlined by Giamei and Tschinkel in Metallurgical Transactions A, Volume 7A, September 1976, pp. 1427–1434, these lead to finer dendrite arm spacings, smaller pores, the suppression of freckle defects, and smaller diffusion distances required during solution heat treatment. The effect of high gradient solidification on the lifetime of single crystal Ni-based superalloys is well known. For example, commercially available CMSX-2 exhibits approximately a doubling in Low Cycle Fatigue life and an order of magnitude improvement in creep rupture life at 870° C. when solidified with a high gradient process compared to a low gradient process (see page 1005, "Directionally Solidified and Single Crystal Superalloys"—The Metals Handbook, Tenth Edition, Volume 1, ASM International 1990).

However, it is also well known in the industry that there are relatively few LMC furnaces in production compared to the very numerous Bridgman furnaces. One reason for this is the very high cost of the LMC furnace, i.e., maintaining a bath of liquid aluminum or tin at a controlled temperature is very complicated and costly. The high cost offsets the improvements in material properties achieved by using the process in most cases. One way to improve this situation would be to increase the production rate at which components are cast using the LMC process. As outlined by Giarnei and Tschinkel, as the rate of withdrawal of the shell mold from the hot zone into the liquid coolant increases, so does the curvature of the solidification front. This is highly undesirable (leading to freckle defects and other problems) and so places an upper limit on the rate of withdrawal and hence the production rate of LMC cast components. What is needed is a means of avoiding this solidification front curvature at higher withdrawal rates, and generally increasing the amount of heat transfer in the process, in order to increase production rates using LMC and hence lower the cost of the process and further improve material properties.

SUMMARY OF THE INVENTION

It is an object of the present invention to provide a method and an apparatus for manufacturing directionally solidified articles using a LMC process overcoming the disadvantages described above and enhancing the LMC process (e.g., higher withdrawal rate and/or temperature gradient) while minimizing solidification front curvature.

According to the invention, a method of casting a directionally solidified article with a casting furnace comprising a heating chamber, a liquid cooling bath as a cooling chamber and a shell mold fed with liquid metal and withdrawn from the heating chamber to the cooling chamber, is characterized in that the method takes place in an inert atmosphere of Ar and/or He in the pressure range of 0.01 to 1 atmosphere. According to a preferred embodiment, the method can be carried out with 0.05 to 0.25 atmosphere pressure and with a gas mixture of He and Ar with 60–100 volume % He.

In another embodiment the gas can be provided from a nozzle arrangement under or above the baffle between the heating chamber and the cooling chamber. It has surprisingly and unexpectedly been discovered that when using a casting furnace with a liquid metal bath as cooling medium and a controlled pressure of the inert gas to enhance the heat transfer between the shell mold and the liquid coolant, it is possible to significantly increase the directional solidification production rate without the adverse consequences of solidification front curvature. It is also possible to introduce the gas within the liquid cooling bath using porous nozzles thus enhancing the method of solidification and at the same time inducing convection currents within the liquid cooling bath, which further enhances heat transfer.

BRIEF DESCRIPTION OF THE DRAWINGS

The invention will be described with reference to the drawings wherein like elements are referred to with the same reference numerals and features which are not necessary for an understanding of the invention have been omitted.

DETAILED DESCRIPTION OF THE PREFERRED EMBODIMENTS

The present invention relates to a method and an apparatus for manufacturing directionally solidified articles using a Liquid Metal Cooling (LMC)-process.

Figure 1:
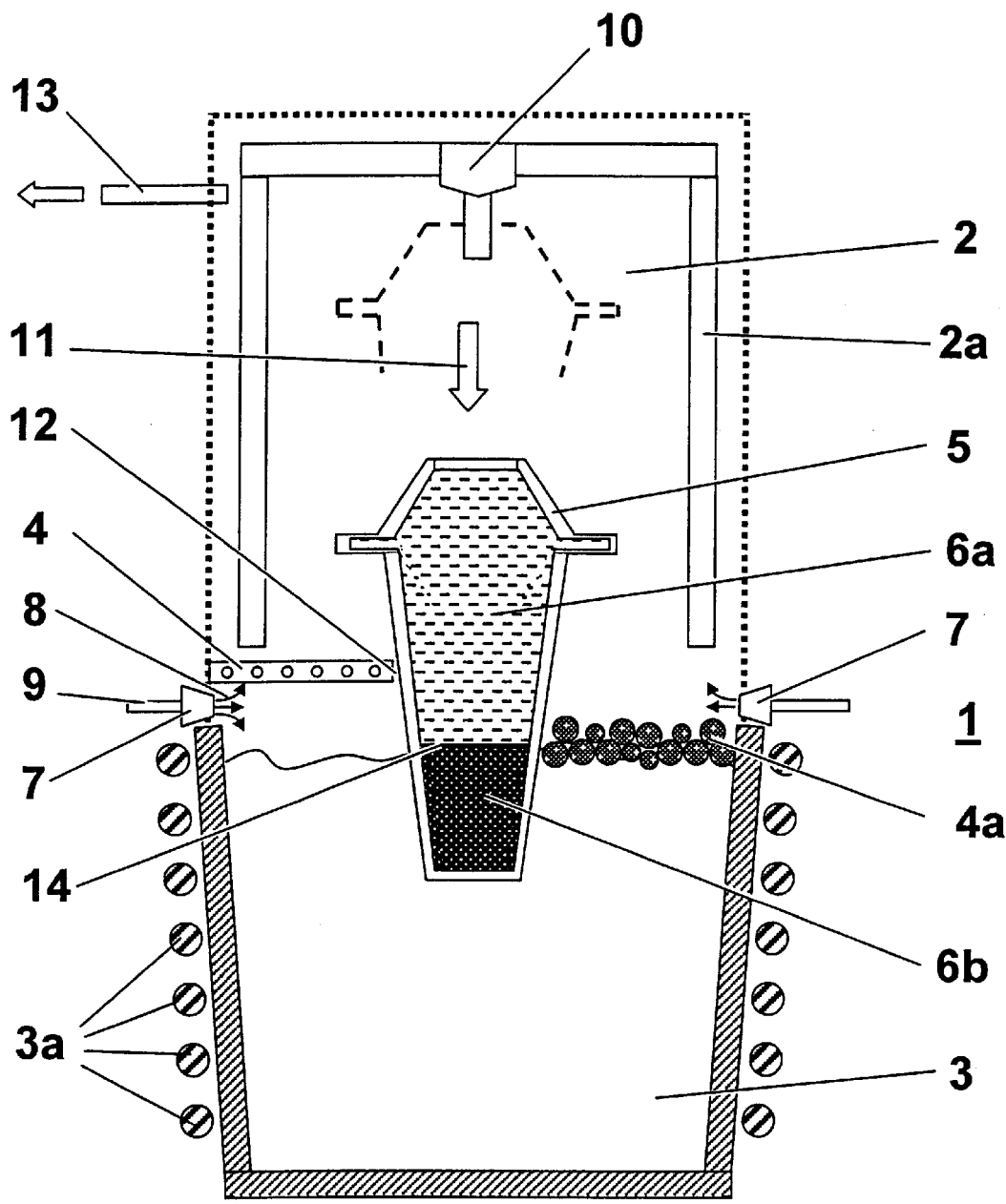
FIG. 1 shows a first embodiment of a LMC casting furnace according to the invention, with a nozzle under/above the baffle between the heating chamber and cooling chamber.

FIG. 1 shows a casting furnace 1 comprising heating chamber 2 and cooling chamber 3. The heating chamber 2 includes heating elements 2a. Both the heating chamber 2 and the cooling chamber 3 are separated by a baffle 4. The cooling chamber 3 use as a coolant a liquid metal bath such as, for example, aluminium at a temperature range between 700° and 900° C. or a liquid tin bath at a range of 300° to 500° C. In order to maintain the temperature of the bath in the mentioned range heating elements 3a may be arranged around the cooling chamber 3.

In the first step of the method for solidifying the directionally solidified article, a shell mold 5 placed within the heating chamber 2 will be filled with a liquid alloy 6a through a feed opening 10 at the top of the heating chamber 2. At the time of charging the mold, the shell mold 5 is in the heating chamber 2 in a position which is shown with a dotted line. After filling the shell mold 5 it is withdrawn continuously from the heating chamber 2 to the cooling chamber 3 through an aperture 12 in the baffle 4. The direction of withdrawal 11 is indicated with an arrow. As soon as the shell mold 5 reaches the cooling chamber 2 solidification of the liquid alloy 6a begins. The solidified alloy 6b is found at the lower portion of the shell mold 5, which already reached the cold zone. Approximately at the border between the heating chamber 2 and the cooling chamber 3 is the solidification front 14. The solidification front 14 grows from the bottom of the shell mold 5 to the top in opposition to the direction of withdrawal 11.

According to the invention, it was unexpectedly discovered that when using a casting furnace 1 with a liquid metal bath 3 as a cooling medium, a controlled pressure of inert gas greatly enhances the heat transfer across the shell mold 5 and increases the production rate substantially without solidification front 14 curvature.

Experimentation has shown that using inert gas such as Ar or He in the pressure range of 0.01 to 1atmosphere, or in a more preferred range of 0.05–0.25 atmosphere, substantially enhances the heat transfer during the LMC process. Table 1 shows the different results for manufacturing two identical turbine blade-like castings, one cast with conventionally LMC in a vacuum atmosphere, the other using a He atmosphere in the more preferred range of 0.1 to 0.25 atmosphere. In both cases an aluminium bath was used as coolant, and the alloy was a commercially available Ni-based single crystal superalloy.

TABLE 1

Experimental Results

| Type | Average Primary Dendrite Arm Spacing | Average Microporosity | Largest Average Micropore Diameter | Micropore Diameter |
|---|---|---|---|---|
| Conventional LMC | 390 μm | 0.25% | 9.77 μm | 76.5 μm |
| LMC According to Invention | 321 μm | 0.17% | 8.63 μm | 60 μm |

The average primary dendrite arm spacing was reduced from 390 μm (conventional) to 321 μm (invention). It is understood that this indicates a substantial increase in thermal gradient across the solidification front 14 during casting. This result will allow a higher withdrawal rate, suppress freckle defects, and lead to longer low cycle fatigue (LCF) and high cycle fatigue (HCF) lives of the cast article.

The average microporosity was reduced from 0.25% (conventional) to 0.17% (invention). Less microporosity is understood to correlate with significant improvements in HCF, LCF and creep rupture lives.

The average diameter of micropore observed was decreased from 9.77 μm (conventional) to 8.63 μm (invention) with the largest micropore decreased from 76.5 μm to 60.0 μm. Again, it is understood that not only volume fraction porosity matters for HCF, LCF and creep lives, but also the size of the pores and the size of the single largest pores.

From these facts it is clear that the LMC process according to the invention offers advantages for the cast article over the conventional LMC process using a vacuum atmosphere. The presence of gas, in particular pure He or a mixture of He and Ar, preferably with (vol. %) 60–100% He, increases heat transfer very significantly compared to the case of LMC casting in a vacuum which represents the state of the art. The foregoing results showed that significant benefits in casting results occurred at gas pressures of 0.05 atmosphere and higher. However, at pressures above 0.25 atmosphere it is possible that problems could occur with furnace control equipment due to the effect of gas convection on the furnace control thermocouples. In principle it is possible to supply the inert gas to the casting furnace 1 through one or more inlets located anywhere in the furnace.

In addition to these general observations, FIG. 1 shows a preferred embodiment using a nozzle arrangement 7 which is connected with a feeding line 9 and which is in the left side of the FIG. 1 arranged under the baffle 4. The nozzle 7 directs a flow 8 of the inert gas against the shell mold 5 increasing the temperature gradient at the solidification front 14. For regulation of the pressure within the heating chamber 2 a gas outlet 13 is provided. As shown in the right side of FIG. 1 it is also possible to arrange a floating baffle 4a on top of the liquid metal bath in which case the nozzle 7 with the feeding line 9 is arranged above the floating baffle 4a. The number of the nozzles 7 shown in FIG. 1 is only exemplary, it being understood that any number of nozzles or suitable gas supply arrangement could be used in accordance with the invention.

Figure 2:
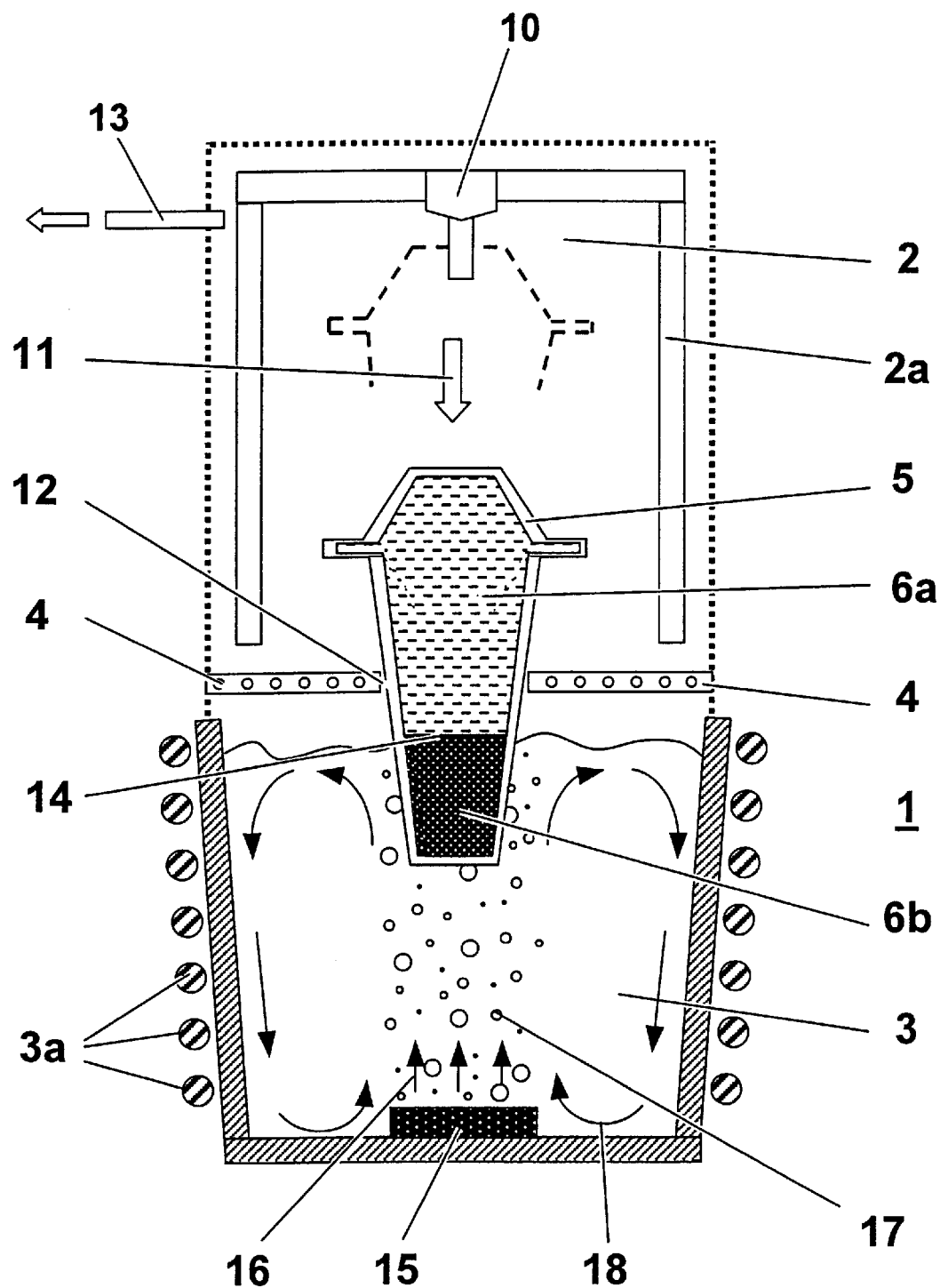
FIG. 2 shows a second embodiment of a LMC casting furnace according to the invention, with a nozzle at the bottom of the cooling chamber and immersed in the liquid coolant.

FIG. 2 shows a second embodiment of a casting furnace 1 for carrying out the method according to the invention. In general, the feeding of the shell mold 5 and the withdrawal from the heating chamber 2 to the cooling chamber 3 is the same as specified in FIG. 1. However, in the FIG. 2 arrangement, during the solidification of the liquid alloy 6a the inert gas will be fed through a nozzle 15 located in the liquid cooling bath 3, preferably at the bottom thereof The nozzle 15, for example, a porous refractory nozzle, may be centered in the middle of the cooling chamber 3 under the shell mold 5. With this embodiment not only the advantages during the solidification are achieved as described above but further a flow 16 will induce a convection current 18 with no moving parts being necessary in the liquid metal bath. This is a further advantage over U.S. Pat. No. 3,763,926 in which a mechanical stirrer is used for generating a current to enhance the heat transfer by ensuring a homogenous temperature within the liquid metal bath. As seen in FIG. 2 the inert gas will be separated into small bubbles 17. This nozzle 15 may be located at the bottom of the liquid coolant bath either centered or at the side, or on the vertical walls of the bath in order to induce convection currents as desired. There may also be more than one immersed nozzle. It is understood that the location of the nozzles 15 and the number of nozzles 15 or suitable gas supply arrangement that will optimize fluid flow and gas introduction will vary as a function of the shape and size of the shell mold being used.

While the invention has been described in detail with reference to specific embodiments thereof, it will be apparent to those skilled in the art that various changes and modifications can be made, and equivalents employed, without departing from the scope of the appended claims.

What is claimed is:

1. A method of casting a directionally solidified article with a casting furnace comprising a heating chamber, a liquid cooling bath as a cooling chamber and a shell mold, wherein during the casting of the directionally solidified article the shell mold is fed with liquid metal and withdrawn from the heating chamber to the cooling chamber, the casting being carried out in an inert atmosphere of Ar and/or He wherein the inert atmosphere is at a controlled vacuum pressure sufficient to enhance heat transfer between the shell mold and the liquid metal.

2. A method of casting a directionally solidified article with a casting furnace comprising a heating chamber, a liquid cooling bath as a cooling chamber and a shell mold, wherein during the casting of the directionally solidified article the shell mold is fed with liquid metal and withdrawn from the heating chamber to the cooling chamber, the casting being carried out in an inert atmosphere of Ar and/or He with an inert gas pressure range of 0.05 to 0.25 atmosphere.

3. The process of claim 2, wherein the inert atmosphere comprises He with up to 40 volume % Ar.

4. The process of claim 1, wherein Ar and/or He gas is supplied to an interior of the casting furnace during the withdrawal of the shell mold.

5. A method of casting a directionally solidified article with a casting furnace comprising a heating chamber, a liquid cooling bath as a cooling chamber and a shell mold, wherein during the casting of the directionally solidified article the shell mold is fed with liquid metal and withdrawn from the heating chamber to the cooling chamber, the casting being carried out in an inert atmosphere of Ar and/or He in the pressure range of 0.01 to 1 atmosphere wherein Ar and/or He gas passes through a nozzle towards the shell mold during the withdrawal of the shell mold.

6. The process of claim 5, wherein the shell mold passes through an opening in a baffle which separates the heating chamber and the cooling chamber during the withdrawal of the shell mold, the nozzle being located beneath the baffle.

7. The process of claim 5, wherein the shell mold passes through a floating baffle which separates the heating chamber and the cooling chamber during the withdrawal of the shell mold, the nozzle being located above the floating baffle.

8. The process of claim 5, wherein Ar and/or He gas passes through a nozzle immersed in the liquid cooling bath during the withdrawal of the shell mold.

9. The process of claim 1, wherein the directionally solidified article is a component of a gas turbine.

10. The process of claim 1, wherein the liquid cooling bath is molten aluminum and/or the liquid metal is a nickel base superalloy.

11. A casting furnace for carrying out the method of claim 1, the casting furnace comprising a heating chamber, a liquid cooling bath as a cooling chamber, a shell mold and at least one nozzle through which an inert gas is directed toward the shell mold.

12. The casting furnace of claim 11, wherein the at least one nozzle is located above a floating baffle which separates the heating chamber from the cooling chamber.

13. The casting furnace of claim 11, wherein the at least one nozzle is located below a baffle which separates the heating chamber from the cooling chamber.

14. The casting furnace of claim 11, wherein the at least one nozzle is immersed in the liquid cooling bath.

15. The casting furnace of claim 11, further comprising a vacuum pump maintaining an interior of the casting furnace at a pressure of 0.01 to 1 atmosphere.

16. The casting furnace of claim 11, wherein the liquid cooling bath is molten aluminum.

17. The casting furnace of claim 11, wherein the shell mold has a cavity therein in the shape of a component of a gas or steam turbine.

18. The casting furnace of claim 11, wherein the cooling chamber includes heating elements which heat the liquid cooling bath above the melting point of a liquid metal coolant therein.

19. The casting furnace of claim 11, wherein the liquid cooling bath includes at least one nozzle therein supplying an inert gas to the bath.

20. The casting furnace of claim 11, wherein the heating chamber includes heating elements which heat the liquid metal in the shell mold.

* * * * *